(12) United States Patent
Dorsey

(10) Patent No.: US 7,419,061 B1
(45) Date of Patent: Sep. 2, 2008

(54) INTEGRATED RACK FOR DISTRIBUTED SIGNAL AND DISTRIBUTED ENERGY COMPONENTS ATTACHABLE TO A FACILITY

(76) Inventor: James Dorsey, 8901 Market Street Rd., Houston, TX (US) 77029-3421

( * ) Notice: Subject to any disclaimer, the term of this patent is extended or adjusted under 35 U.S.C. 154(b) by 380 days.

(21) Appl. No.: 11/073,515

(22) Filed: Mar. 7, 2005

(51) Int. Cl.
*A47F 5/00* (2006.01)

(52) U.S. Cl. .................. 211/26; 211/94.01; 211/151; 211/162

(58) Field of Classification Search .............. 211/26, 211/119.004, 86.01, 94.01, 135, 151, 162; 312/265.1; 361/600, 601, 641
See application file for complete search history.

(56) References Cited

U.S. PATENT DOCUMENTS

| | | | | | |
|---|---|---|---|---|---|
| 3,169,810 | A | * | 2/1965 | Levy et al. ............... | 312/140.1 |
| 3,404,931 | A | * | 10/1968 | Fall et al. ................. | 312/265.4 |
| 4,126,364 | A | * | 11/1978 | Reilly ....................... | 312/140 |
| 5,250,752 | A | * | 10/1993 | Cutright ................... | 174/363 |
| 5,292,189 | A | * | 3/1994 | Lau et al. ................. | 312/265.3 |
| 5,380,083 | A | * | 1/1995 | Jones et al. .............. | 312/265.3 |
| 5,536,079 | A | * | 7/1996 | Kostic ...................... | 312/265.3 |
| 5,584,406 | A | * | 12/1996 | Besserer et al. ........... | 211/189 |
| 5,934,485 | A | * | 8/1999 | Harris et al. ............... | 211/26 |
| 5,979,672 | A | * | 11/1999 | Gemra et al. .............. | 211/26 |
| 6,102,214 | A | * | 8/2000 | Mendoza .................. | 211/26 |
| 6,238,029 | B1 | * | 5/2001 | Marzec et al. ........... | 312/265.3 |
| 6,293,637 | B1 | * | 9/2001 | Anderson et al. ........ | 312/265.1 |
| 6,401,940 | B1 | * | 6/2002 | Hartel et al. .............. | 211/26 |
| 2001/0002657 | A1 | * | 6/2001 | Mendoza ................. | 211/26 |
| 2002/0172012 | A1 | * | 11/2002 | Chandler .................. | 361/724 |
| 2003/0034717 | A1 | * | 2/2003 | Yao ......................... | 312/223.1 |
| 2005/0247650 | A1 | * | 11/2005 | Vogel et al. .............. | 211/26 |

* cited by examiner

*Primary Examiner*—Katherine Mitchell
*Assistant Examiner*—Colleen M. Quinn
(74) *Attorney, Agent, or Firm*—Buskop Law Group, PC; Wendy Buskop

(57) ABSTRACT

An integrated rack for distributed signal and distributed energy components attachable to a facility includes a first end plate with a first front and first back side, a second end plate with a second front and second back side, a back wall for engaging the back sides of the end plates. The top of the back wall engages a facility ceiling and the bottom of the back wall engages a facility floor. At least one wireway can be disposed in the back wall. A opening can be formed between a first mounting angle connected to the first front side and a second mounting angle connected to the second front side and wherein the mounting angles comprises at least one perforation per inch. At least one distributed signal or distributed energy equipment can be removably mounted to the perforations on the mounting angles.

47 Claims, 12 Drawing Sheets

INTEGRATED RACK FOR DISTRIBUTED SIGNAL AND DISTRIBUTED ENERGY COMPONENTS ATTACHABLE TO A FACILITY

FIELD

The present embodiments relate to integrated racks for distributed signal and distributed energy components, wherein the racks are attachable to a facility.

The present embodiments relate to a facility with a communication system, a power system, and an environmental conditioning system that requires a distributed signal and energy flows. The facility comprises integrated racks for holding equipment used in power and signal distribution.

BACKGROUND

The invention relates to integrated racks for supporting a number of transmission units and signal units on one or more racks each having a number of compartments. The signal units have a control circuit and a transmitting or receiving circuit connected to the control circuit for the wireless transmission or reception, respectively, of a signal containing an identification number assigned to the unit and each unit having a register for storing the assigned number, a reception means for receiving a scanning signal from outside the unit and a transmission means for transmitting a response signal in response to a received scanning signal. The unit may, for example, be a paging unit of a transponder, an alarm transmitter, an electronic key, or similar devices.

A need exists for an integrated rack for which the assembly, installation, and use reduces overall energy consumption to a facility.

A need also exists for an integrated rack that improves overall safety by removing a need for use of modular flooring.

A further need exists for an integrated rack that does not require on-site welding and provides enhanced fire safety over existing racks and enclosures, eliminating a need for fire suppression equipment.

A need exists for an integrated rack having sufficient openings for accessing equipment and running wiring, thereby eliminating any trapped areas to monitor.

A need exists for an integrated rack that provides additional maintenance access over existing racks and enclosures for allowing efficient and safe removal of equipment.

The present embodiments meet these needs.

BRIEF DESCRIPTION OF THE DRAWINGS

In the detailed description of the embodiments presented below, reference is made to the accompanying drawings, in which.

Figure 1:
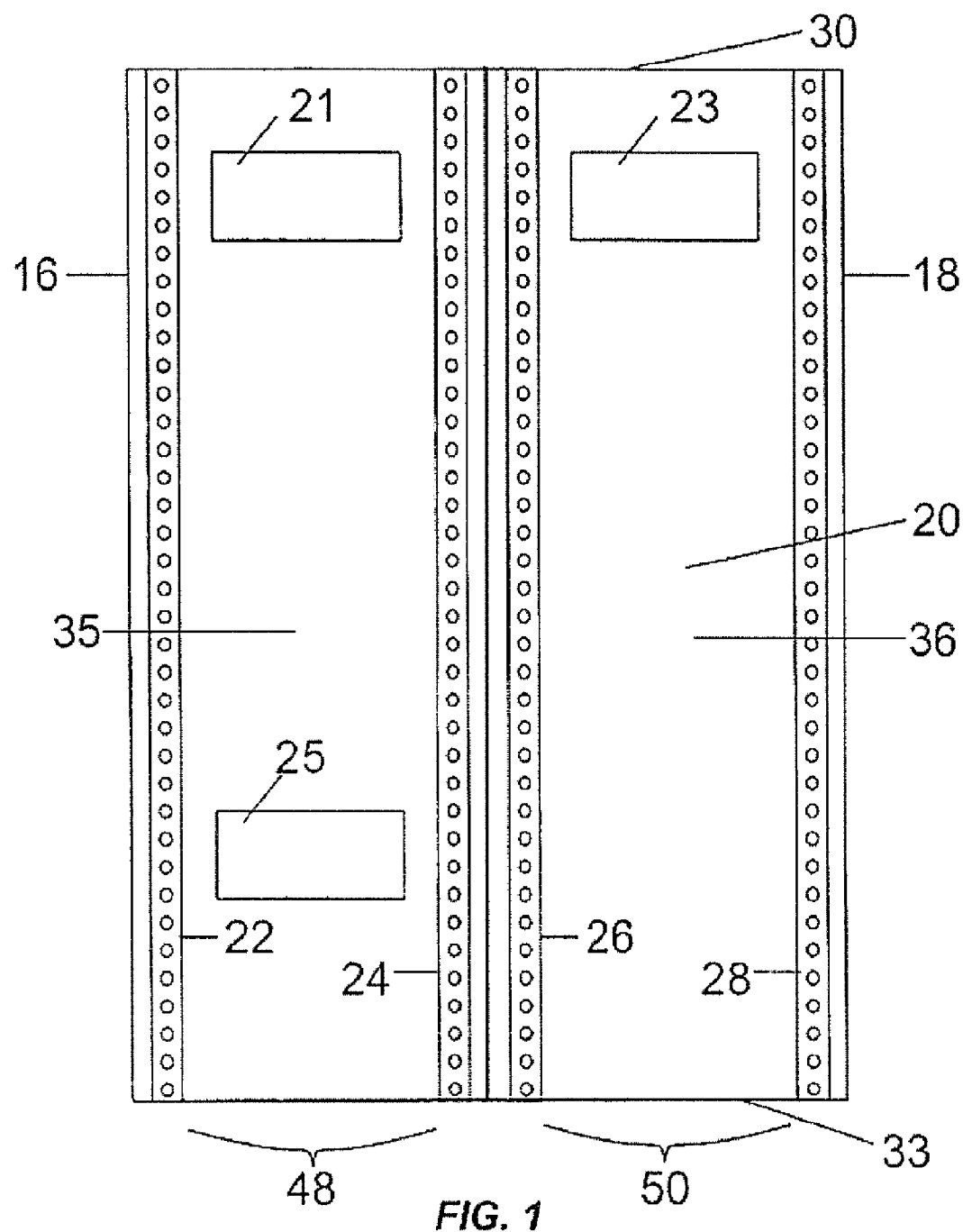
FIG. 1 depicts a front view of the two bay construction of an integrated rack.

The present embodiments are detailed below with reference to the listed Figures.

DETAILED DESCRIPTION OF THE EMBODIMENTS

Before explaining the present embodiments in detail, it is to be understood that the embodiments are not limited to the particular descriptions and that it can be practiced or carried out in various ways.

An integrated rack for distributed signal and distributed energy components attachable to a facility is made of two end plates, each with a front side and a back side. The rack has a back wall connected to the back sides of the end plates. The top of the back wall is connected to a facility ceiling and the bottom of the back wall is connected to the facility floor. The back wall includes one or more wireways.

A rack can include two mounting angles connected to the front sides of the end plates. The mounting angles have one or more perforations per inch. One or more pieces of distributed signal or distributed energy equipment are removably mounted through the perforations on the mounting angles. The opening of the integrated rack is between the mounting angles.

The present embodiments relate to integrated racks for use in facilities, such as a high rise office building, a residential building, or a chemical facility. The integrated racks save in heating, cooling, and lighting costs. The racks are cost saving because a computer floor is not required in a facility where the integrated rack is installed. Under floor fire suppression equipment, software, and detectors are not needed without a computer floor. Fire suppression chemicals are a known hazard to people. The use of the integrated racks described herein eliminates the need for Halon™ and FM200 chemicals that can suffocate a person when used in a small space.

The integrated racks improve safety in an environment that requires signal and energy distribution. The integrated racks eliminate the need for raised floors that typically present tripping hazards to people.

An embodiment of the invention can be for a facility comprising a communication system, a power system, and an environmental conditioning system that requires a distributed signal and an energy flows. The embodiment can further comprise an integrated rack for holding equipment for power and signal distribution. The integrated rack can comprise, a first end plate, wherein the first end plate can comprise a first front side and a first back side, a second end plate comprising a second front side and a second back side. The integrated rack can also comprise a back wall for engaging the first back side and the second back side. The back wall can comprise a top portion engagable with the ceiling of a facility and a bottom portion engagable with the floor of a facility, and at least one wireway disposed in the back wall. A face can be formed between a first mounting angle connected to the first front side and a second mounting angle connected to the second front side. The mounting angles can comprise at least one perforation per inch. At least one distributed signal or distributed energy equipment can be removably mounted to the perforations on the mounting angle.

Figure 2:
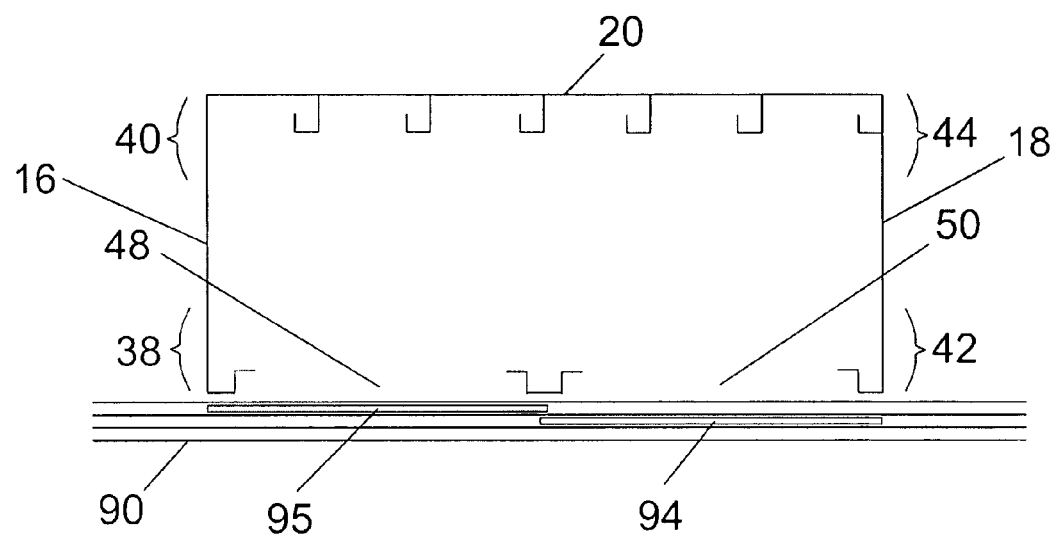
FIG. 2 depicts a top view of the two bay construction of an integrated rack.

With reference to the figures, FIG. 1 and FIG. 2 are a front view and a top view, respectively, of a two bay construction of the integrated rack. The integrated rack is used to hold equipment for distributing signal and energy in a facility. Each rack can comprise from 1 bay to 100 bays. An embodiment of the invention is a nineteen bay integrated rack. The pieces of the integrated rack can be composed of a metal, but equally durable materials can be used.

Shown in FIG. 1 the integrated rack can be made of a first end plate (16) and a second end plate (18). The integrated rack can have a top (30) and a bottom (33). The top can engage a track mounted in the ceiling and the bottom of the rack can engage a track in the floor.

A first panel (35) and a second panel (36) are shown fastened together to form a back wall (20). The back wall (20) can have wireways (21, 23, and 25) to run wire through. The wire can be power cable, data cable or any other item that requires access to the inside of the rack, such as a pipe carrying cooling fluid. The wire ways (21, 23, and 25) can be located in the top or bottom portion of the back wall (20) and include an opening with a height from about 6 inches to about 24 inches and a length from about 6 inches to about 22 inches. Two of the wireways (21 and 23) are depicted in the top portion of the back wall (20), while a third wireway (25) is depicted in the bottom portion of the back wall (20).

Shown in FIG. 1 the integrated rack includes a first opening (48) formed between a first mounting angle (22) and a second mounting angle (24) and a second opening (50) formed between a third mounting angle (26) and a fourth mounting angle (28). The opening (48) allows a doors to be placed over the openings (48 and 50).

The first mounting angle (22) is between the first opening (48) and the first end plate (16). The second mounting angle (24) is between the second opening (50) and the second end plate (18).

FIG. 2 depicts a first end plate (16) has a first front side (38) and a first back side (40) and a second end plate (18) with a second front side (42) and a second back side (44). The plates can be from about 6 feet to about 10 feet, and a depth from about 36 inches to about 24 inches.

The integrated rack can include a back wall (20) that engages the first end plate (16) and the second end plate (18). The tops of doors (94 and 95) are shown in a top view engaged in a door ceiling track (90). The doors (94 and 95) cover the openings (48 and 50).

The back wall (20) can be attached to the first and second end plates (16 and 18), by welding but can also be one piece with the back wall (20) or they can be attached in any other suitable matter. The back wall (20) can be connected to the end plates (16 and 18) at intervals of from about 1 inches to about 72 inches using mechanical connections, such as bolts, rivets, clamps, screws, and combinations thereof.

The rack can include one or more tracks secured to the facility floor. The tracks can be made from composites, aluminum, steel, high density plastic, fiberglass, alloys of these materials or combination of these materials. The length of the tracks can be the length of the room where the tracks are installed. In an embodiment, the rack has a first track secured to the facility floor and a second track secured to the facility ceiling. The tracks can be connected to the floor by welding and the ceiling by general fasteners, such as screws or bolts.

Figure 3:
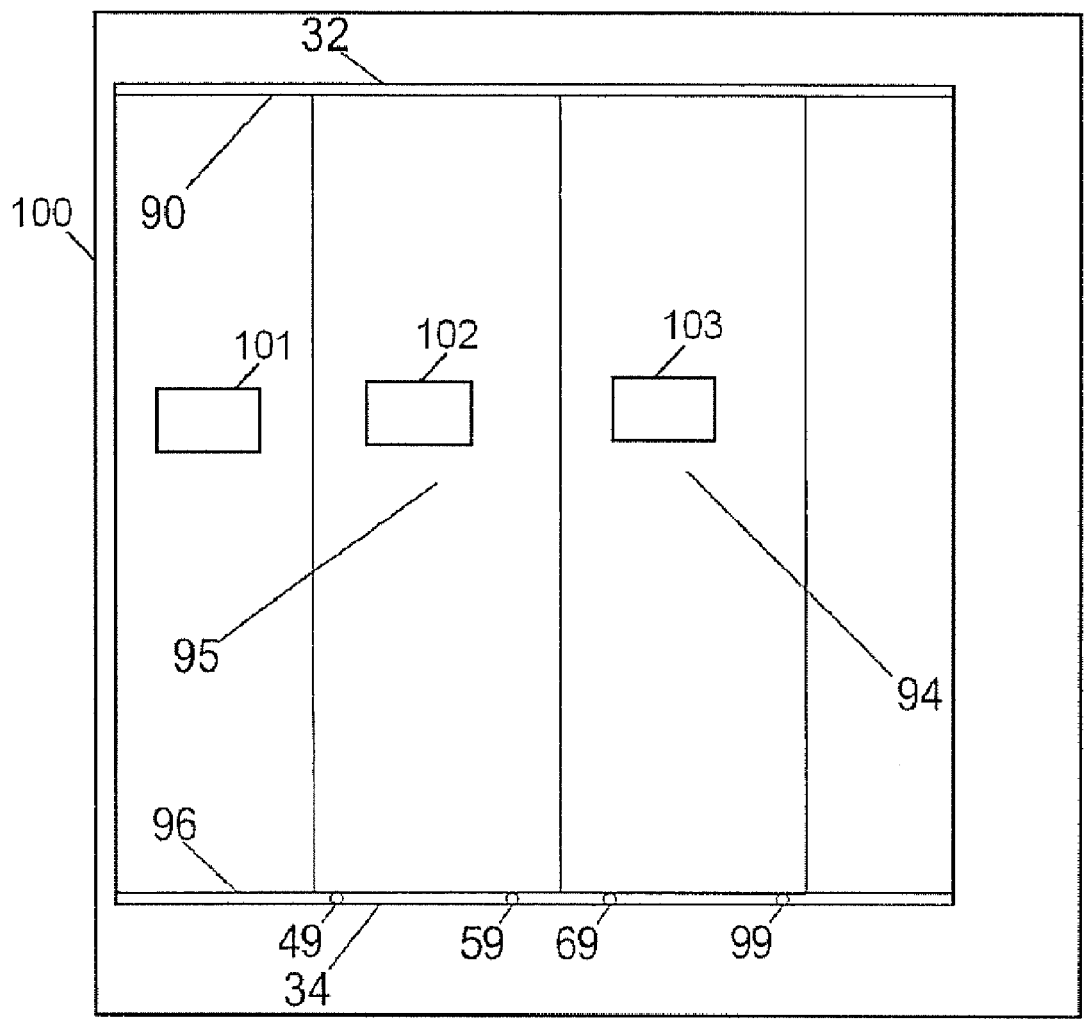
FIG. 3 depicts a front view of the two bay construction of an integrated rack with a track to support the doors.

FIG. 3 depicts a front view of an integrated rack with doors (94 and 95) in front of the integrated rack. The integrated rack can include a floor track (96) mounted on the facility floor (34) and a ceiling track (90) mounted on the facility ceiling (32). One or more doors (94 and 95) are then installed between the floor tracks (96) and ceiling tracks (90). The doors (94 and 95) can have wheels (49, 59, 69, and 99) that ride along the floor tracks (96). Facility (100) is also shown with the integrated rack having a communication system (101), a power system (102), and an environmental conditioning system (103).

Figure 4:
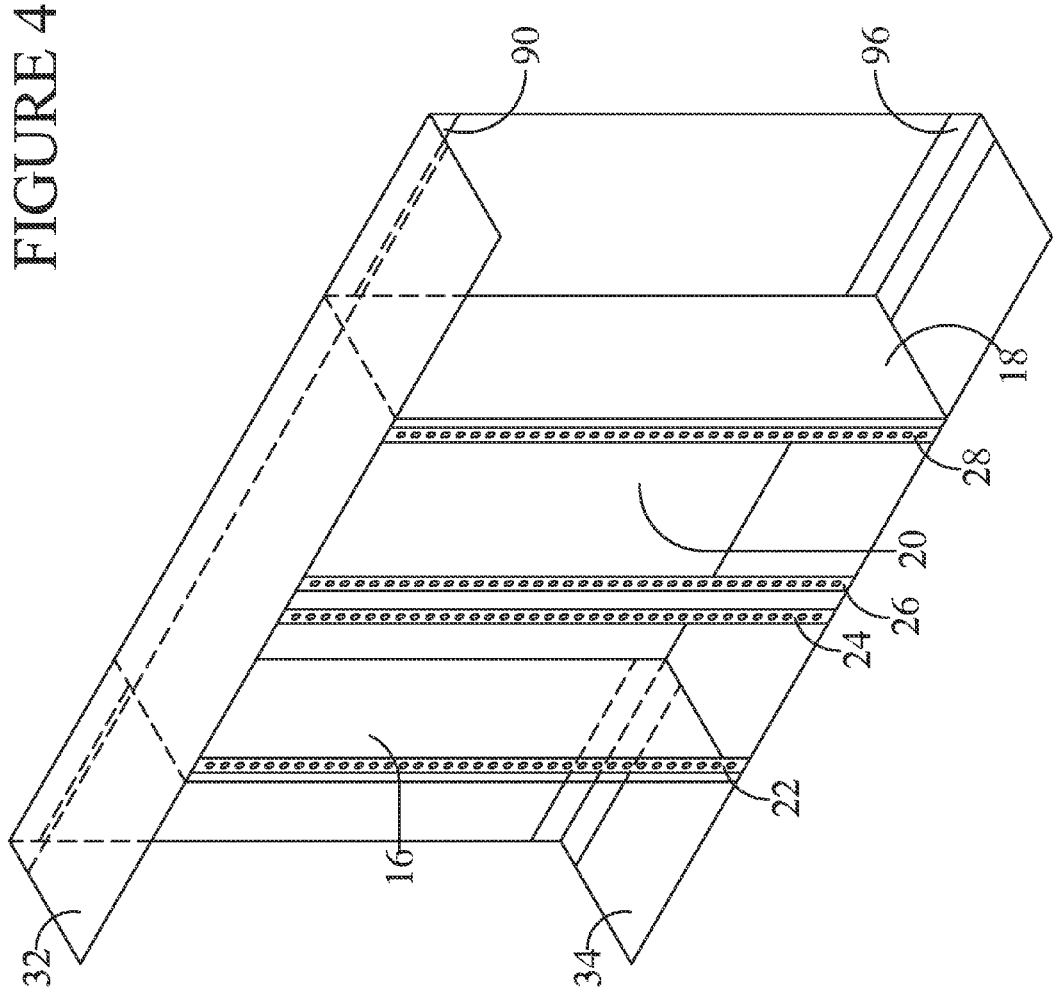
FIG. 4 depicts a perspective view of an integrated rack.

FIG. 4 depicts a perspective view of the integrated rack with the back wall (20) connected to the end plates (16 and 18). The mounting angles (22, 24, 26, and 28) are shown at the front of the rack. The mounting angles can be used to mount any form distributed signal and an energy flows equipment or even rack mountable computer equipment such as servers, routers, switches, or any other rack mountable equipment. In the depicted embodiment, the back wall (20) is shown engaging a floor track (96) mounted in a facility floor (34) and a ceiling track (90) mounted in a facility ceiling (32).

Figure 5:
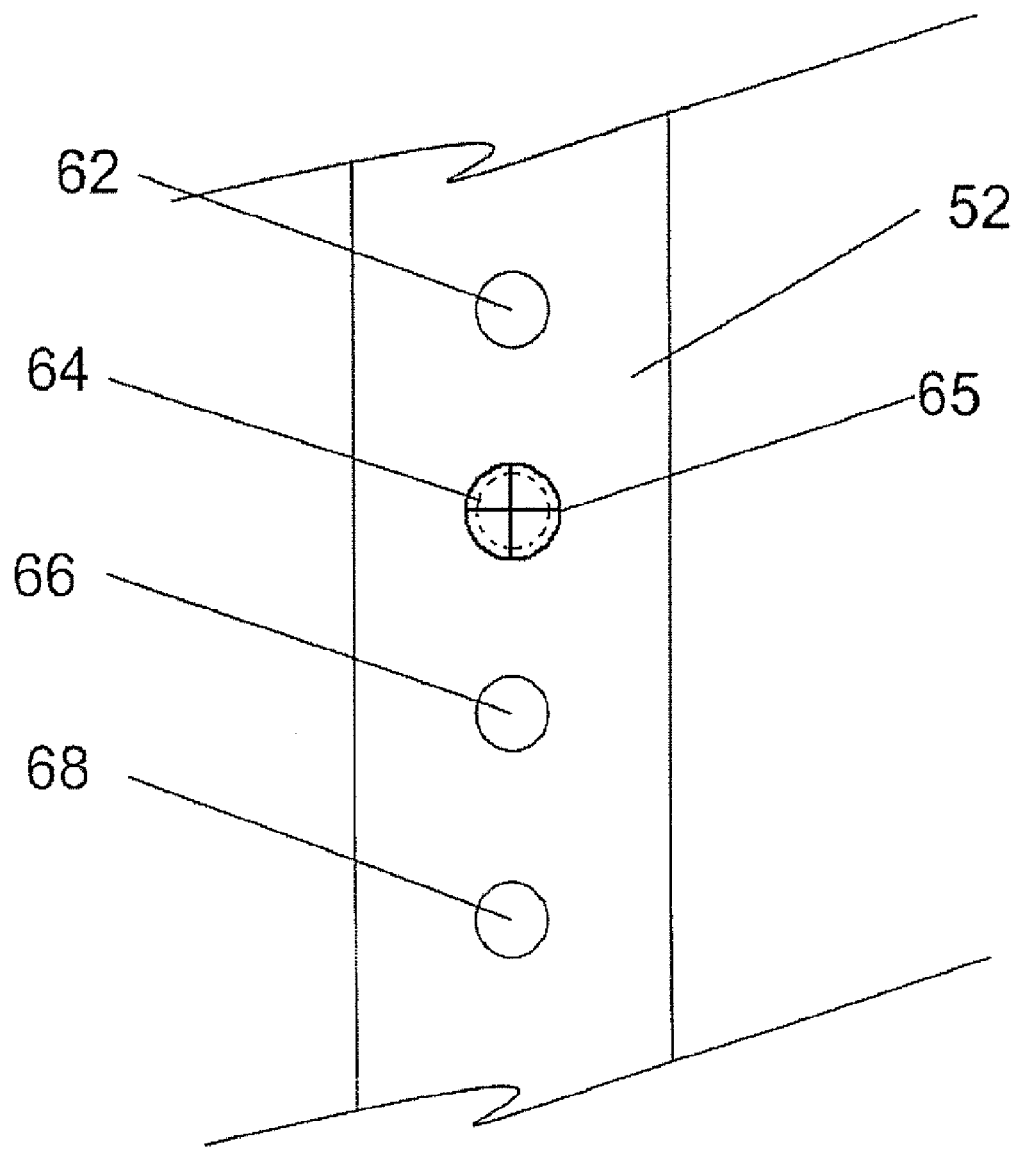
FIG. 5 depicts a top view of a portion of a mounting angle.

FIG. 5 is a front view of a portion of fastening plate (52) of a mounting angle. In FIG. 5 the fastening plate (52) is depicted with one or more perforations (62, 64, 66, and 68) per inch. An embodiment can have up to four perforations per inch. The perforations (62, 64, 66, and 68) allow the mounting angles to engage a fastener, such as a screw, a bolt, a pin, and combinations thereof. FIG. 5 depicts one of the perforations (64) engaging a screw (65). Each perforation has a hole with a diameter ranging from about $1/16$ inches to about $3/4$ inches. The distributed signal or distributed energy equipment is removably mounted onto the integrated rack through the perforations. The mounting angles are disposed over the entire length of the end plates. The mounting angles can be made from metal, composites, aluminum, steel, high density plastic, fiberglass, alloys of those materials, and combinations thereof. The size of the mounting angles can be about 2 inches wide and any length. The mounting angles can be fixed together by welding or by other mechanical way such as clamps, bolts, screws, and similar devices.

Figure 6:
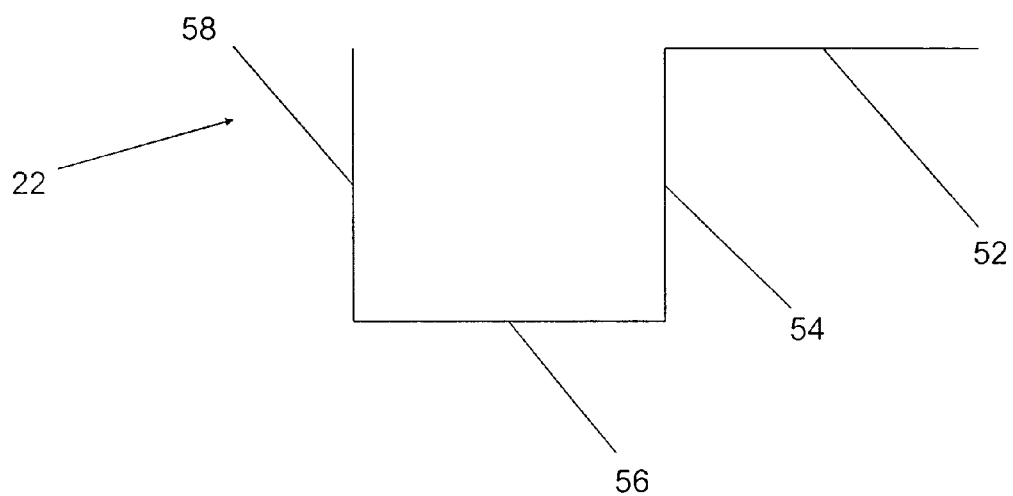
FIG. 6 depicts a face view of a portion of a mounting angle.

FIG. 6 depicts a top view of a mounting angle (22). Each mounting angle includes a fastening plate (52) with perforations in a first end. The fastening plate (52) has a second end without perforations. A first plate (54) is mounted substantially perpendicular to the fastening plate (52) on the second end, a second plate (56) is mounted substantially perpendicular to the first plate (54), and a third plate (58) can be mounted substantially perpendicular to the second plate (56).

Figure 7:
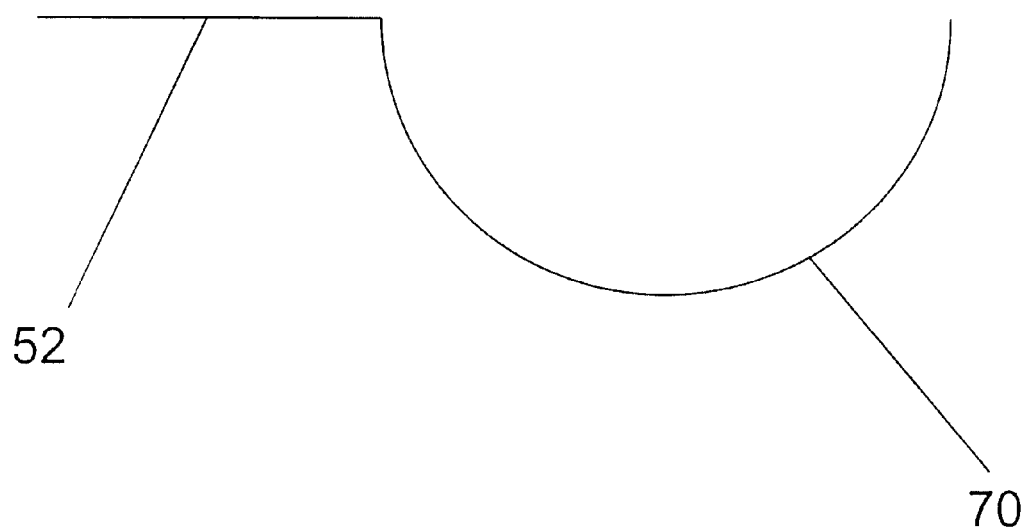
FIG. 7 depicts a top view of a different embodiment of a mounting angle.

FIG. 7 depicts a top view of a mounting angle, wherein a fastening plate (52) can be mounted at a right angle to a U-shaped plate (70).

The panels can be a molded one piece construction and can be constructed of aluminum, steel, high density plastic, fiberglass, graphite composites, laminates, alloys, and combinations thereof. The dimensions for a panel can include a length of about 16 inches, a depth of about 3 inches, and a height from about 6 feet to about 12 feet. In an embodiment, the panels can be fastened together in a substantially parallel orientation to form the back wall, such as by using any type of adhesive or mechanical fastener, including but not limited to bolts, rivets, clamps, screws, and combinations thereof.

Figure 8:
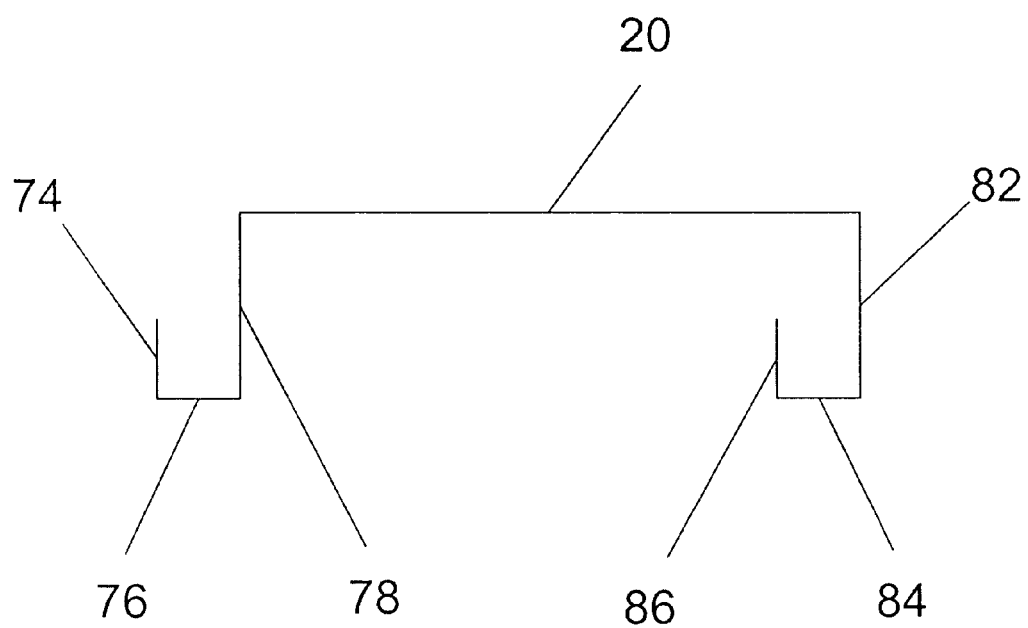
FIG. 8 depicts a top view of a panel.

FIG. 8 depicts a top view of the back wall (20) with a first plate (78) and second plate (82) attached to the back wall (20). A third plate (76) is attached to the first plate (78) and a fourth plate (84) is attached to the second plate (82). A fifth plate (74) is attached to the third plate (76) and a sixth plate (86) is attached to the fourth plate (84). The back wall and the first through sixth plates can be from about 6 feet to about 12 feet in height. The first, third and fifth plates can be a one piece bracket. The second, fourth and sixth plates can be a one piece bracket. The one piece brackets can give strength to the back wall and guide the wire within the rack.

Figure 9:
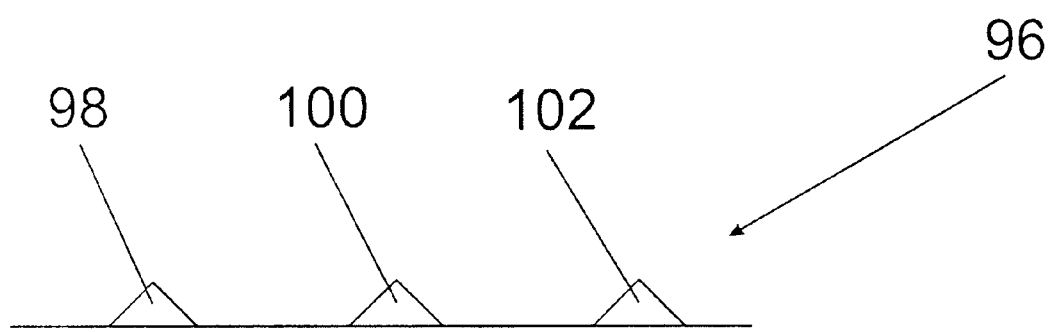
FIG. 9 depicts an end view of the floor track.

FIG. 9 depicts a floor track as base plate (96) with one or more rails (98, 100, and 102). The rails (98, 100, and 102) engage the doors to create a sliding connection.

Figure 10:
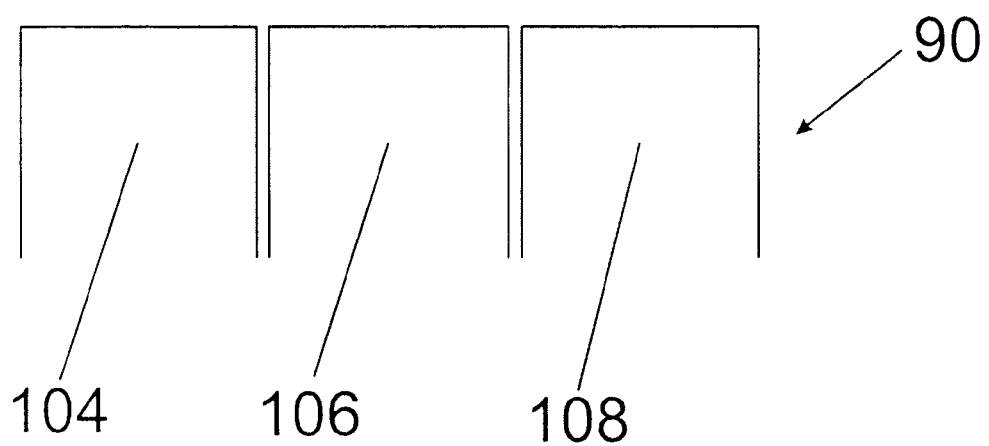
FIG. 10 depicts an end view of the ceiling track.

FIG. 10 depicts a ceiling track shown includes one or more U-shaped guides (104, 106, and 108) that surround the sliding door. The top of the doors can fit in the guides (104, 106 and 108).

An embodiment can be a facility comprising an integrated rack. The facility includes a communication system, a power system, and an environmental conditioning system that require distributed signals and energy flows. The integrated rack holds equipment used for the power and signal distribution.

Figure 11:
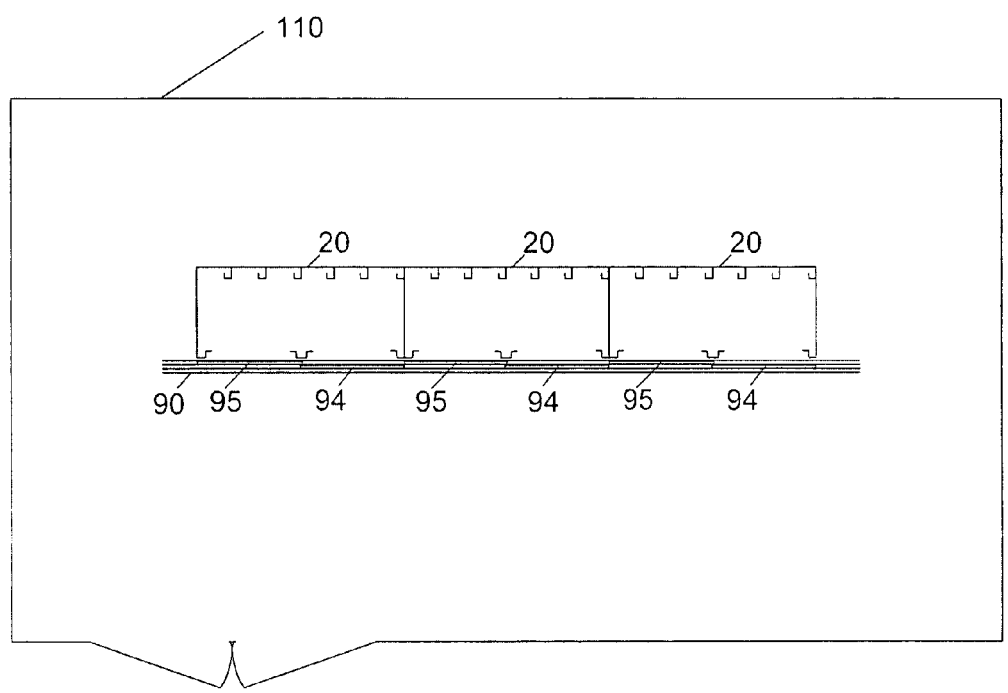
FIG. 11 depicts a facility with integrated racks installed.

FIG. 11 depicts a facility (110) with three integrated racks located in the facility (110) the integrated racks each have a back wall (20) that is aligned with the adjacent integrated rack. The ceiling track (90) is shown holding the doors (94 and 95) for the three integrated racks.

The energy supply to the integrated rack can be 24 volt direct current, 110 volt alternating current, 220 volt alternating current, 480 volt alternating current or combinations thereof.

The communication system in the facility can be a distributed control system or a safety shut down system. The power system can be a power distribution system. The environmental conditioning system can be an emissions monitoring system.

Examples of facilities that can comprises the integrated racks are high rise buildings, industrial manufacturing complexes, chemical processing plants, food and beverage manufacturing facilities, cryogenic plants for manufacturing gases, pulp and paper manufacturing facilities, and other similar facilities. Other facility examples are refineries and breweries.

Figure 12:
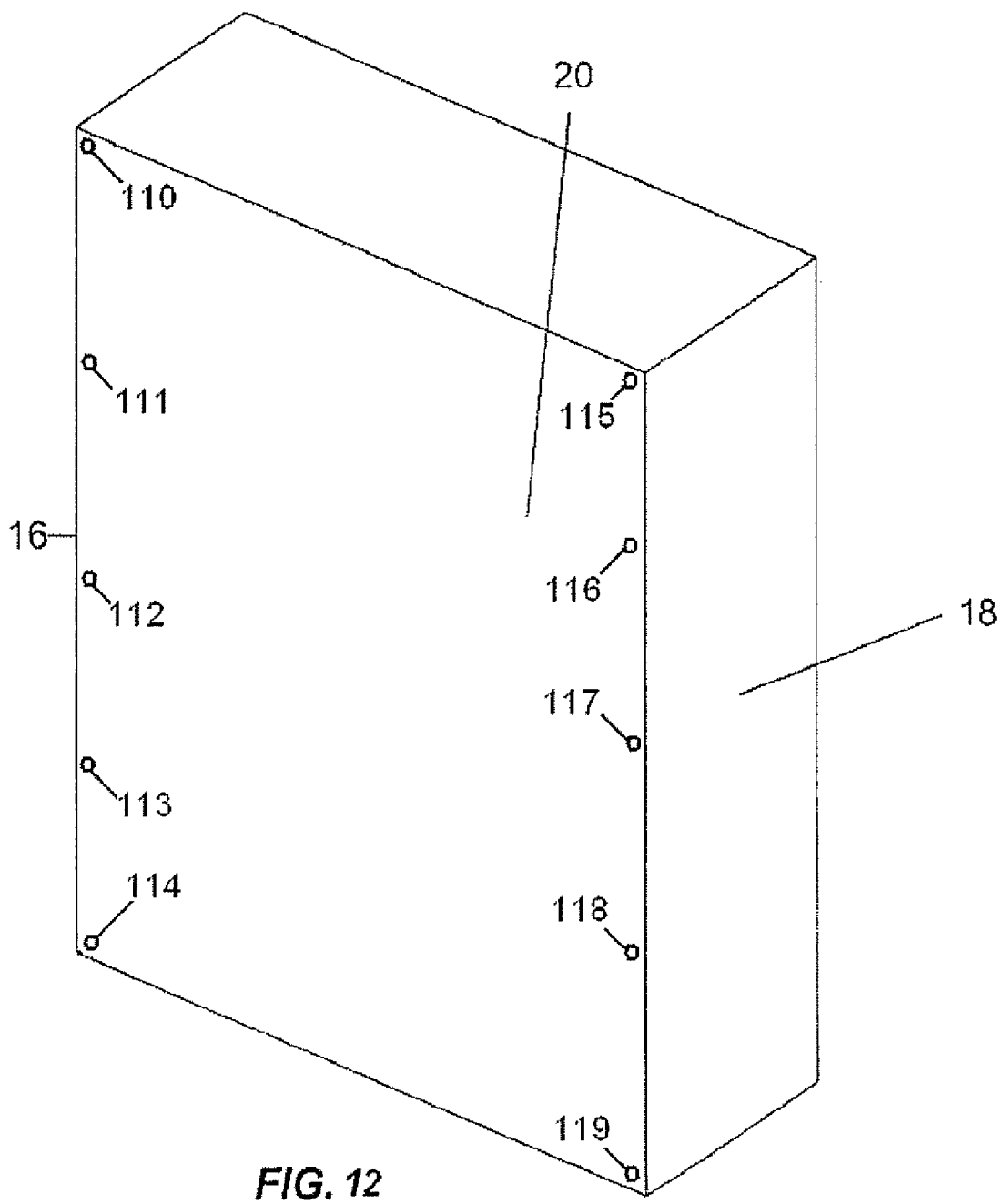
FIG. 12 depicts a perspective view of the back of an integrated rack.

FIG. 12 depicts a perspective view of the back of the integrated rack. The back wall (20) is shown connected to the first end plate (16) by five rivets (110, 111, 112, 113, and 114). The back wall (20) is shown connected to the second end plate (18) by five rivets (115, 116, 117, 118, and 119). Each rivets is contemplated to extend through the back wall (20) into the back side of the connected end plate.

The embodiments have been described in detail with particular reference to certain embodiments thereof, but it will be understood that variations and modifications can be effected within the scope of the embodiments, especially to those skilled in the art.

What is claimed is:

1. An integrated rack for distributed signal and distributed energy components attachable to a facility comprising of:
   a. a first end plate comprising a first front side and a first back side;
   b. a second end plate comprising a second front side and a second back side;
   c. a back wall for engaging the first back side and the second back side, and wherein at least one wireway is disposed in the back wall;
   d. a top connected to the back wall;
   e. a bottom connected to the back wall;
   f. an opening formed between a first mounting angle comprising a fastening plate with a first end and a second end and a first plate mounted substantially perpendicular to the fastening plate and a second plate mounted directly to and substantially perpendicular to the first plate and a third plate mounted directly to and substantially perpendicular to the second plate, wherein the first mounting angle is connected to the first front side and a second mounting angle comprising a fastening plate with a first end and a second end and a first plate mounted substantially perpendicular to the fastening plate and a second plate mounted directly to and substantially perpendicular to the first plate and a third plate mounted directly to and substantially perpendicular to the second plate, wherein the second mounting angle is connected to the second front side, wherein the mounting angles comprise a perforation per inch; and wherein at least one distributed signal or distributed energy equipment is removably mountable through the perforations on the mounting angles; and an integrated rack door slidably installed in both a first track secured to the facility floor and in a second track secured to the facility ceiling, wherein the door further comprises wheels that ride along the first track.

2. The integrated rack of claim 1, wherein the first end plate, the second end plate, the back wall, are comprised of a metal.

3. The integrated rack of claim 1, wherein the integrated rack comprises from 1 bay to 100 bays.

4. The integrated rack of claim 1, wherein the at least one wireway in the back wall further comprises at least three wireways.

5. The integrated rack of claim 1, wherein the wireway is disposed in the bottom portion of the back wall.

6. The integrated rack of claim 1, wherein the wireway comprises an opening with a height from about 6 inches to about 24 inches and a length from about 6 inches to about 22 inches.

7. The integrated rack of claim 6, wherein the opening in the wireway comprises a height of about 12 inches and the length of about 16 inches.

8. The integrated rack of claim 1, wherein the back wall is welded to the first end plate and the second end plate.

9. The integrated rack of claim 1, wherein the back wall is further installed in at least one track that is secured to the facility floor.

10. The integrated rack of claim 1, wherein the first track is welded to the facility floor.

11. The integrated rack of claim 1, wherein the back wall comprises a mechanical connection to the first end plate and second end plate at integrals of from about 1 inch to about 72 inches.

12. The integrated rack of claim 11, wherein the mechanical connection is a member selected from the group consisting of: a bolt, a rivet, a clamp, a self drilling self tapping screw, and combinations thereof.

13. The integrated rack of claim 1, wherein the mounting angles are comprised of a metal.

14. The integrated rack of claim 13, wherein a fastener is inserted into the perforations, the fastener selected from the group consisting of a screw, a bolt, a pin, and combinations thereof.

15. The integrated rack of claim 1, wherein the perforations comprise a hole with a diameter from about 1/16 inches to about 3/4 inches.

16. The integrated rack of claim 1, wherein the first mounting angle and the second mounting angle comprises up to four perforations per inch.

17. The integrated rack of claim 1, wherein the back wall comprises at least two panels fastened together.

18. The integrated rack of claim 17, wherein the at least two panels are comprised of aluminum, steel, high density plastic, fiberglass, graphite composites, laminates, alloys, and combinations thereof.

19. The integrated rack of claim 17, wherein one of the at least two panels comprises a length of about 16 inches, a depth of about three inches, and a height from about 6 feet to about 12 feet.

20. The integrated rack of claim 19, wherein the at least two panels are molded one piece constructions.

21. The integrated rack of claim 1, wherein the floor track comprises a base plate on which are disposed at least one rail, and wherein the rail engages the door creating a sliding connection.

22. The integrated rack of claim 1, wherein the ceiling track comprises at least one U-shaped guide, wherein at least one U-shaped guide surrounds the door.

23. A facility comprising a communication system, a power system, and an environmental conditioning system that requires a distributed signal and an energy flow, further comprising an integrated rack for holding equipment for power and signal distribution, wherein the integrated rack comprising:
   a. a first end plate comprising a first front side and a first back side;
   b. a second end plate comprising a second front side and a second back side;
   c. a back wall for engaging the first back side and the second back side and, wherein the back wall has a top engagable with the ceiling of a facility and a bottom engagable with the floor of a facility, and at least one wireway disposed in the back wall;
   d. an opening formed between a first mounting angle comprising a fastening plate with a first end and a second end and a first plate mounted substantially perpendicular to the fastening plate and a second plate mounted directly to and substantially perpendicular to the first plate and a third plate mounted directly to and substantially perpendicular to the second plate, wherein the first mounting angle is connected to the first front side and a second mounting angle comprising a fastening plate with a first end and a second end and a first plate mounted substantially perpendicular to the fastening plate and a second plate mounted directly to and substantially perpendicular to the first plate and a third plate mounted directly to and substantially perpendicular to the second plate, wherein the second mounting angle is connected to the second front side; wherein the mounting angles comprise at least one perforation per inch; and wherein at least one distributed signal or distributed energy equipment can be removably mounted to the perforations on the first mounting angle and the second mounting angle; and further comprising a floor track mounted between the first mounting angle and the second mounting angle on the facility floor; a ceiling track mounted between the first and second mounting angles on the facility ceiling; and a door slidably installed on both the floor track and the ceiling track, wherein the door further comprises wheels that ride along the floor track.

24. The facility of claim 23, wherein the facility is a high rise building, an industrial manufacturing complex, a chemical processing plant, a food and beverage manufacturing facility, a cryogenic plant for manufacturing gases, a pulp and paper manufacturing facilities, a refinery, a brewery or combinations thereof.

25. The facility of claim 23, wherein the communication system is a distributed control system, a safety shut down system, or combinations thereof.

26. The facility of claim 23, wherein the power system is a power distribution system.

27. The facility of claim 23, wherein the environmental conditioning system is an emissions monitoring system.

28. The facility of claim 23, wherein the first end plate, the second end plate, and the back wall are comprised of a metal.

29. The facility of claim 23, wherein the integrated rack comprises from 1 bay to 100 bays.

30. The facility of claim 23, wherein the at least one wireway in the back wall further comprises at least three wireways.

31. The facility of claim 23, wherein the wireway is disposed in the bottom portion of the back wall.

32. The facility of claim 23, wherein the wireway comprises an opening with a height from about 6 inches to about 24 inches and a length from about 6 inches to about 22 inches.

33. The facility of claim 32, wherein the opening in the wireway comprises the height of about 12 inches and the length of about 16 inches.

34. The facility of claim 23, wherein the back wall is welded to the first end plate and the second end plate.

35. The facility of claim 23, wherein the first track is welded to the facility floor.

36. The facility of claim 23, wherein the back wall comprises a mechanical connection to the first and second end plates at integrals of from about 1 inch to about 72 inches.

37. The facility of claim 36, wherein the mechanical connection is a member selected from the group consisting of at least one bolt, at least one rivet, at least one clamp, at least one self drilling self tapping screw, and combinations thereof.

38. The facility of claim 23, wherein the first mounting angle and the second mounting angle are comprised of a metal.

39. The facility of claim 23, wherein a fastener is inserted into the perforations, the fastener selected from the group consisting of a screw, a bolt, a pin, and combinations thereof.

40. The facility of claim 23, wherein the perforation comprise a hole with a diameter ranging form about 1/16 inches to about 3/4 inches.

41. The facility of claim 23, wherein each mounting angle further comprises up to four perforations per inch.

42. The facility of claim 23, wherein the back wall comprises at least two panels fastened together.

43. The facility of claim 42, wherein the back wall is made from a member selected from the group consisting of: aluminum, steel, high density plastic, fiberglass, graphite composites, laminates, alloys, and combinations thereof.

44. The facility of claim 42, wherein the back wall comprises a length of about 16 inches, a depth of about three inches, and a height ranging from about 6 feet to about 12 feet.

45. The facility of claim 44, wherein the at least two panels are molded one piece constructions.

46. The facility of claim 23, wherein the floor track comprises a base plate on which are disposed at least one rail and wherein the rail engages the door creating a sliding connection.

47. The facility of claim 23, wherein the ceiling track comprises at least one U-shaped guide, wherein the guide surrounds the door.

* * * * *